United States Patent

[11] 3,597,697

[72] Inventor John Matarese
New City, N.Y.

[21] Appl. No. 839,221
[22] Filed July 7, 1969
[45] Patented Aug. 3, 1971
[73] Assignee General Telephone & Electronics Laboratories, Incorporated

[54] INTEGRATABLE GYRATOR
7 Claims, 2 Drawing Figs.

[52] U.S. Cl. .......... 330/63, 330/30 R, 330/24, 330/30 D, 333/80 T
[51] Int. Cl. .......... H03f 9/00, H03f 3/04
[50] Field of Search .......... 330/63, 85, 109; 333/80, 80 T, 24.1

[56] References Cited

UNITED STATES PATENTS

| | | | |
|---|---|---|---|
| 3,001,157 | 9/1961 | Sipriss et al. | 333/24.1 X |
| 3,255,364 | 6/1966 | Warner, Jr. | 307/304 |
| 3,300,738 | 1/1967 | Schlicke | 333/24.1 |
| 3,400,335 | 9/1968 | Orchard et al. | 330/24 |

*Primary Examiner*—Nathan Kaufman
*Attorneys*—Robert J. Frank and Amster and Rothstein ABSTRACT: A two-port gyrator circuit which can be manufactured by standard silicon monolithic techniques, is capable of simulating an inductor with a high Q-factor at frequencies ranging from DC to 100 kHz. without compensation, and has low operating voltage and power dissipation requirements. The gyrator circuit is similar to that disclosed in application Ser. No. 839,036, except that the dual power supplies have magnitudes of 6 volts rather than 12 volts. To achieve maximum dynamic range with DC stages and yet to retain the advantages of the gyrator disclosed in application Ser. No. 839,036, a different amplifier having internal gain and external attenuation is provided.

PATENTED AUG 3 1971

3,597,697

INVENTOR.
JOHN MATARESE

BY Amster & Rothstein

ATTORNEYS

INTEGRATABLE GYRATOR

GYRATOR

This invention relates to gyrators and more particularly to semiconductor gyrators for simulating high Q-inductors which can be manufactured by standard silicon monolithic integrated circuit techniques.

The gyrator is a nonreciprocal two-port network with an admittance matrix $$\begin{bmatrix} 0 & g_1 \\ -g_2 & 0 \end{bmatrix}$$

where $g_1$ and $g_2$ are the gyrator transconductances. It was first proposed and described by B. Tellegen in an article entitled "The Gyrator, a New Electric Element" in Philips Research Report, 1948, pp. 81—101. The gyrator has the property that an admittance $y$ connected to one port is transformed into an impedance $y/g_1g_2$ presented at the other port; consequently, a capacitance $C$ can be transformed into an inductance $L=C/g_1 g_2$.

A two-port network having the admittance matrix of a gyrator can be implemented with the use of two voltage-to-current converters. Each port has two input terminals; typically, one terminal of each port is grounded. A first converter is connected in one direction between the remaining two terminals, one in each port, and the second converter is connected between the same two terminals but in the opposite direction. The two converters have respective phase shifts of 0° and 180°. For the two voltage-to-current converters to provide the ideal gyrator admittance network, it is necessary that each converter have infinite input and output impedances.

Two general approaches have been taken to maximize the input impedances (to the order of megohms). The first technique used in the prior art was to provide a pair of transistors arranged in a Darlington configuration at the input of each converter. A Darlington pair has a very high input impedance. However, it was found that a gyrator used to convert a capacitor across the output port to an inductor across the input port, and which was designed to realize a Q-factor in the order of several hundred, became unstable at frequencies in the order of a few tens of kiloHertz. As described in U.S. Pat. No. 3,400,335 issued to H. J. Orchard et al. on Sept. 3, 1968, this instability arose due to phase shifts, particularly phase shifts in the input stage of each converter when this stage included bipolar transistors.

The second approach taken in the prior art to realize a high input impedance for each converter, as described in the above-identified Orchard et al. patent, was to eliminate the Darlington input circuit in each converter and to use instead a metal oxide semiconductor field-effect transistor (MOSFET). Such a transistor has a very high input impedance and with it stable gyrators can be designed which are suitable for use at frequencies as high as 100 kHz. (The basic gyrator circuit itself does not provide a stable operation at frequencies this high, but capacitor compensation circuits can be provided internally for increasing the upper frequency.) one problem with this approach, however, is that it is exceedingly difficult to fabricate bipolar and MOS transistors on the same substrate.

In most cases, it is desirable to operate a gyrator over a frequency range extending to DC; conventional gyrator circuits therefore include DC stages. This requires that the output stage of each converter, in addition to offering a very high impedance to the connected port, also be maintained at a ground quiescent voltage. A typical prior art output stage includes a pair of complementary bipolar transistors, such as those shown in the above-identified Orchard et al. patent. If the gyrator is to be made on a single substrate, this requires that both NPN and PNP transistors be formed. Most of the transistors made by present-day standard silicon monolithic techniques are of the NPN type. Although various types of PNP transistors can be formed on the same substrate, they either require additional processing steps and are therefore more costly, or are of inferior quality particularly with respect to their gain and frequency response.

Typically, in a prior art gyrator the NPN transistor in each complementary pair functioned as a constant current source and the PNP transistor was driven from a DC amplifier in the respective voltage-to-current converter. This necessarily degraded the performance in the case of low-quality PNP transistors but was accepted due to the fact that the quiescent output voltage of the DC amplifier had a polarity compatible with the drive requirements of the PNP transistor only.

Another problem encountered in the design of prior art gyrators is that of limited dynamic range. The admittance matrix for an ideal gyrator has two transconductances which are independent of input amplitude. In actual practice, however, a gyrator does not operate linearly for large amplitude inputs. In a typical gyrator, both positive and negative voltage supplies are provided. (With the use of a complementary pair in each converter output stage, and the requirement of a zero-quiescent level and output swings in either direction, it is necessary to use two opposite polarity sources.) The dynamic range of the gyrator is obviously limited by the magnitudes of the supplies. But in prior art gyrators the dynamic range generally has been limited to an even greater extent, primarily due to the quiescent voltage levels selected for the various active elements.

Each of the transconductances which characterizes a prior art gyrator is typically dependent upon various elements in a respective one of the two voltage-to-current converters. In fact, equations for the transconductances have been given in the literature which are exceedingly complex and are dependent upon numerous resistances and the characteristics of the various transistors in each converter. These complex equations require considerable effort in the selection of component values for any given design in order to achieve particular transconductance values.

In my copending application Ser. No. 839,036, filed on July 7, 1969, a gyrator circuit is disclosed which overcomes the aforesaid problems associated with prior art gyrators. The circuit, which can be made exclusively of bipolar transistors by standard silicon monolithic techniques, includes a Darlington pair at the input of each voltage-to-current converter and is capable of stable operation at frequencies in excess of those obtainable even with gyrators having field-effect transistors at their inputs. More specifically, the gyrator has a Q-factor of 250 up to 100 kHz. without internal capacitive compensation, and the same Q-factor up to 1 MHz. with internal capacitive compensation. A complementary pair of bipolar transistors is included in the output stage of each converter, but the frequency response of the gyrator is not degraded as a result of the use of low-quality PNP transistors on a substrate which for the most part contains NPN transistors. This is achieved by making the operation of the PNP transistor independent of the input voltage to the respective converter. The gyrator also has a very large dynamic range and each of the transconductance parameters is determined solely by a single resistor in the respective voltage-to-current converter.

The improved frequency response of the gyrator disclosed in my copending application is achieved partly due to the use of a modified Darlington pair at the input of each voltage-to-current converter. The input stage of each voltage-to-current converter also includes a difference amplifier. The amplifier is provided with feedback; one of the two inputs to the difference amplifier is connected to an associated one of the two gyrator ports, and the other input to the difference amplifier is connected to an amplifier output. This arrangement improves both the frequency response and the dynamic range of the gyrator.

The output stage of each voltage-to-current converter disclosed in my copending application includes a complementary pair of transistors. The frequency characteristic of the PNP transistor fabricated on the same integrated circuit substrate is not as good as that of an NPN transistor, and for this reason the PNP transistor is used only as a constant current source.

The NPN transistor in the associated pair serves to control the amount of current delivered by the constant current source (PNP transistor) to the impedance connected to the associated port. In other words, the PNP transistor provides a constant current which is divided between the impedance connected to the associated port and the NPN transistor in the same pair. The input voltage to each converter controls the amount of current which flows through the NPN transistor, and the balance necessarily flows through the impedance connected to the associated port. In this manner, the frequency characteristic of the PNP transistor has a minimal effect on the frequency response of the overall gyrator.

The dynamic range of my earlier gyrator is maximized by judiciously choosing a bias voltage for the NPN transistor which is approximately two-thirds of the magnitude of either voltage source (the two voltage sources have equal magnitudes). The two design objectives of driving the NPN output transistor by the output of the difference amplifier and yet maintaining its base at a quiescent level which allows maximum dynamic range would appear to be incompatible in a gyrator which includes DC stages. However, various transistors in the circuit are arranged to function as Zener diodes for level shifting purposes in order to achieve both of the desired objectives.

Basically, each of the voltage-to-current converters in my earlier gyrator includes an amplifier at the input having a gain of unity and a single NPN transistor at the output which serves to convert the amplifier output voltage to a proportional current. The input voltage and output current are related to each other solely by the magnitude of a single resistor in the emitter circuit of the output NPN transistor. Thus, each of the transconductances in the admittance matrix is governed solely by the value of a single resistor.

The gyrator circuit disclosed in my copending application utilizes dual power supplies each having a magnitude of 12 volts. The level necessary which is necessary to achieve the desired objectives entails the use of Zener diodes. Typically, the Zener diode voltage is approximately 7.5 volts in an integrated circuit. Each voltage-to-current converter requires two Zener diodes connected in series, one for shifting the quiescent level of the difference amplifier output to ground (in order that it be coupled to an input of the difference amplifier) and another to shift the same output level to a negative potential (in order that it be coupled to the NPN transistor in the output stage). These two level shifts in series require a total drop of 15 volts and the duel power supplies must together exceed this voltage drop. The use of two 12-volt supplies necessarily results in considerable power dissipation.

It is a general object of this invention to provide an integratable gyrator circuit having all of the advantages of the gyrator circuit disclosed in my copending application, without requiring the use of relatively large power supplies to thereby reduce the power dissipation. More specifically, it is an object of the present invention to provide a similar gyrator circuit requiring power supplies of only half the magnitude of those utilized in my earlier gyrator circuit.

This is accomplished in accordance with the principles of my present invention, by deriving two utilizable output voltages from the difference amplifier in each voltage-to-current converter. A first of these is coupled through a single Zener diode to the output stage. Because only a single Zener diode is used for this purpose, rather than two as in my earlier gyrator circuit, the two supplies may be smaller in magnitude. However, with such an arrangement the DC level of the difference amplifier collector output coupled to the output stage is higher than the DC level of the difference amplifier input to which the output voltage is fed back by less than 7.5 volts. Thus, it is not possible to directly couple the output back to the input as in my earlier gyrator.

Instead, the output voltage is fed back to the input of the difference amplifier through a resistance network. By properly choosing the component values, the feedback can be achieved without affecting the zero-quiescent level of the difference amplifier input to which the output signal is fed back. However, the use of such a resistance divider network increases the gain of the difference amplifier and, as described in my copending application, for maximum dynamic range the gain of the difference amplifier should be unity. For this reason, in accordance with the principles of my present invention, although the internal gain of each difference amplifier exceeds unity, the output signal is attenuated before it is applied to the output stage of the respective voltage-to-current converter. Thus the attenuation in the external circuit offsets the internal difference amplifier gain so that the total voltage gain from input to output is unity. Thus the overall circuit operation is similar to that of my earlier gyrator, except that because lower supply voltages are required there is reduced power dissipation.

It is a feature of my invention to provide a difference amplifier in each voltage-to-current converter of a gyrator circuit, the amplifier having an internal gain in excess of unity as a result of feedback from the output to the input, and external attenuation to reduce the overall voltage gain of the converter while maintaining a wide dynamic range.

Further objects, features and advantages of my invention will become apparent upon a consideration of the following detailed description in conjunction with the drawing, in which.

Figure 1:
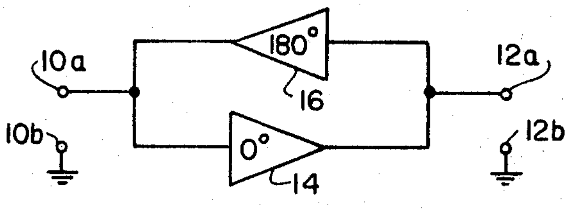
FIG. 1 is a block diagram of a basic gyrator system.

Referring to the basic gyrator system depicted in FIG. 1, one port includes terminals 10*a*, 10*b* and the other port includes terminals 12*a*, 12*b*. Terminals 10*b*, 12*b* are grounded. Between terminals 10*a*, 12*a* are two oppositely phased voltage-to-current converters 14, 16 connected in parallel in opposite directions. Assuming that some network is placed across each port, and further assuming that each converter has infinite input and output impedances, it can be shown that the current flowing through the first external network from terminal 10*b* to terminal 10*a* is equal to the potential difference between terminals 12*a*, 12*b* multiplied by a factor $g_1$. Similarly, the current flowing through the second network from terminal 12*b* to terminal 12*a* is equal to the potential difference between terminals 10*a*, 10*b* multiplied by a factor $-g_2$. It can further be shown that if a capacitance $C$ is placed across terminals 12*a*, 12*b* (the output port), then the impedance seen looking into terminals 10*a*, 10*b* (the input port) is an inductance of value $C/g_1g_2$.

The uppermost voltage-to-current converter is shown as having a phase shift of 180°. This is interpreted as follows: If terminal 12*a* goes positive with respect to terminal 12*b*, then increased current flows in the direction from terminal 10*b* to terminal 10*a*. (This would have the effect, were a resistor placed across terminals 10*a*, 10*b*, of causing terminal 10*a* to go negative with respect to terminal 10*b*—a phase shift of 180° relative to the initial voltage change across terminals 12*a*, 12*b*.) The 0° phase shift of converter 14 is interpreted in the converse manner: If terminal 10*a* goes positive with respect to terminal 10*b*, then current flows through an impedance connected to the output port in the direction from terminal 12*a* to terminal 12*b*.

Figure 2:
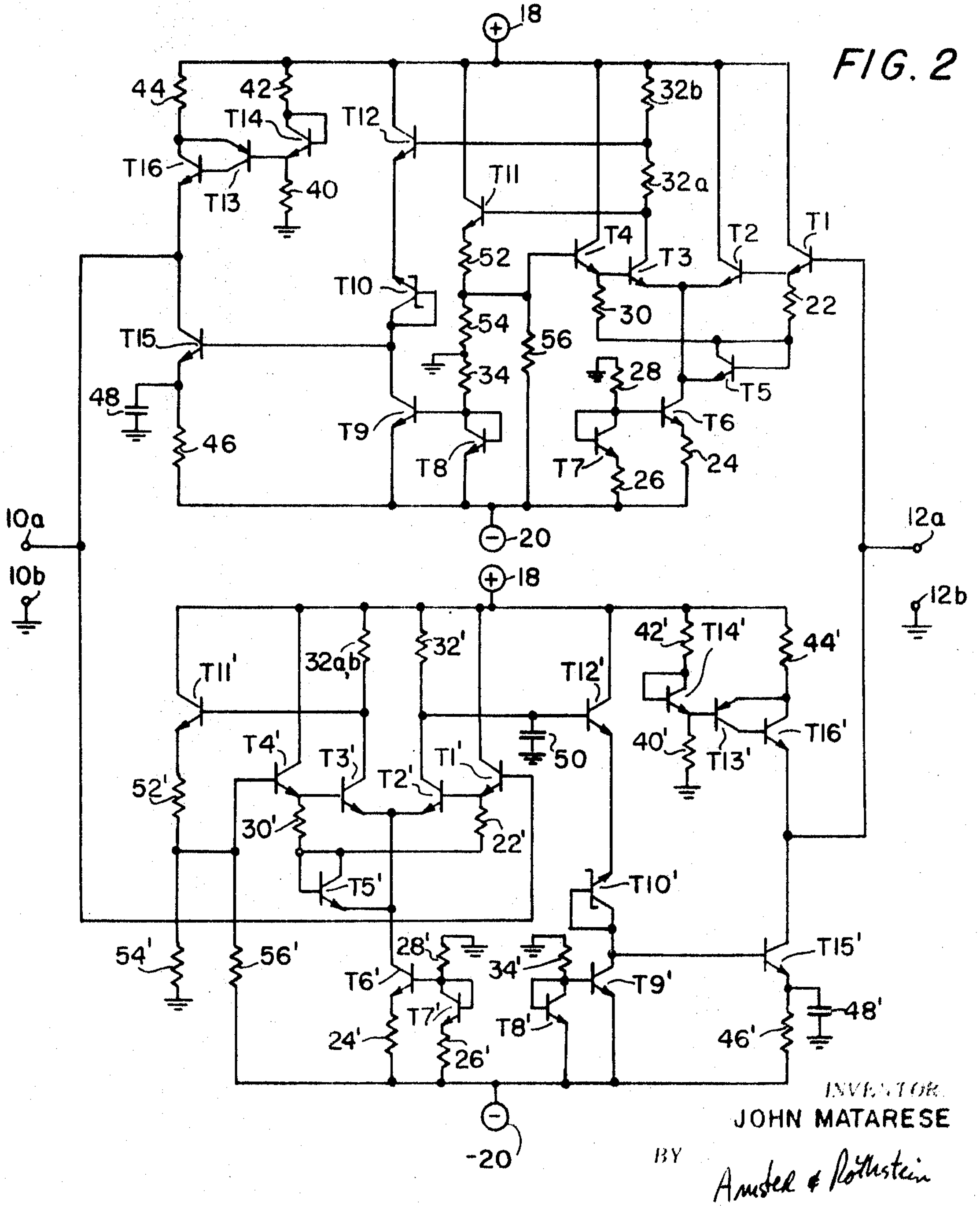
FIG. 2 is an illustrative circuit diagram of a gyrator designed in accordance with the principles of my invention.

The circuit of FIG. 2 is arranged to correspond to the block diagram of FIG. 1. The same numerals are used for the two ports. If an imaginary line is drawn between terminals 10*a*, 12*a*, the circuitry above the line corresponds to converter 16 in FIG. 1 and the circuitry below the line corresponds to converter 14 in FIG. 1.

The circuit of FIG. 2 is very similar to the circuit disclosed in my copending application. To a great extent the description of my earlier circuit applies to FIG. 2, and a complete understanding of the present invention, except for its novel aspects, may be had with reference to my copending application. In what follows, the operation of the circuit of FIG. 2 will be described only briefly except insofar as it is different from the operation described in my earlier application.

Considering first the uppermost voltage-to-current converter, the input stage includes a difference amplifier having two NPN transistors T2,T3. Transistors T6,T7 form a constant current source to which the emitters of transistors T2,T3 are connected. The input voltage at terminal 12$a$ is extended through transistor T1 to the base of transistor T2, one input of the difference amplifier. Transistors T1,T2 form a Darlington pair for achieving a high input impedance, and transistor T5 improves the stability and frequency response of the system by allowing small resistor 22 to provide a bias current for the Darlington pair.

The other input to the difference amplifier is at the base of transistor T4, transistors T3 and T4 forming another Darlington pair. The voltage at the collector of transistor T3 is a function of the difference of the base voltage of transistor T2 and the base voltage of transistor T3.

Transistors T8,T9 form a constant current source to control the flow of current through transistor T12 and Zener diode T10. The difference amplifier output voltage at the junction of resistors 32$a$, 32$b$ is coupled to the base of transistor T12. Since the voltage drop across Zener diode T10 is constant (7.5 volts), the collector of transistor T9 follows the base voltage of transistor T12.

The output stage of the voltage-to-current converter includes a complementary pair of transistors, T13 and T16 acting as a composite PNP transistor, and NPN transistor T15. Transistor T14 maintains the base of transistor T13 (the base of the composite PNP transistor) at a fixed potential, transistors T13 and T16 thus serving as a constant current source. The constant current from the composite PNP transistor flows to the collector of transistor T15. The extent to which transistor T15 conducts is determined by the voltage at the collector of transistor T9. The transconductance of the voltage-to-current converter is determined by the magnitude of resistor 46 and the voltage gain of the difference amplifier.

The lower voltage-to-current converter operates in a similar manner except for a 180° phase inversion. To achieve the phase inversion the difference amplifier output is taken from the collector of transistor T2'. (In general, prime symbols are used for the lower voltage-to-current converter together with the equivalent numerals in the upper converter.) The feedback, however, is from the collector of transistor T3' to the base of transistor T4' since the feedback in the two converters is the same. A more complete description of the basic circuit will be found in my copending application. The same numerals have been used in both the present application and my earlier application for this reason.

In my earlier circuit, resistors 52, 54 and 56 are not provided, nor is transistor T11 included in the circuit in the position shown. Instead, transistor T11 is connected between the emitter of transistor T12 and the emitter of transistor T10 and serves as another Zener diode. The junction of the two Zener diodes is connected directly to the base of transistor T4; there is no other input to this transistor. Also, in my earlier circuit the collector of transistor T3 is connected only through a single resistor to positive source 18, and the base of transistor T12 is connected directly to the collector of transistor T3. The quiescent voltage at the collector of transistor T3 is 8.1 volts. The drop across the base-emitter junction of transistor T12 is 0.6 volts and the drop across Zener diode T11 (connected in the emitter circuit of transistor T12) is 7.5 volts. Thus with an additional Zener diode T11 between transistors T12 and T10, the emitter of transistor T10 is at a quiescent level of 0 volts. The emitter of transistor T10 is coupled directly to the base of transistor T4 since in the quiescent condition one input to the difference amplifier is grounded. However, the base of transistor T4 follows changes in the voltage at the collector of transistor T3, since the drop across the base-emitter junction of transistor T12 does not vary from approximately 0.6 volts, nor does the drop across the additional Zener diode (T11) change from 7.5 volts. There is 100 percent feedback.

As described in my copending application, for maximum dynamic range it is desirable that the base of transistor T15 be biased at a potential approximately equal to two-thirds of the magnitude of negative source 20. The dual supplies in my earlier circuit both have a magnitude of 12 volts, and thus the base of transistor T15 should be held approximately at −8 volts in the quiescent condition. More specifically, the bias potential is −7.5 volts. It is, of course, not feasible to drive the base of transistor T15 directly from the collector of transistor T3 since the quiescent voltage of the latter is +8.1 volts. Nor can the base of transistor T15 be driven from the collector of the additional Zener diode T11 included in my earlier circuit because the voltage of the latter in the quiescent condition is at 0 volts. However, in my earlier circuit transistor T10 serves as the second level-shifting Zener diode and the collector of transistor T10 (collector of transistor T9) is at a quiescent level of −7.5 volts. Thus the two Zener diodes T10,T11 serve to shift the level at the output of the difference amplifier to the desired −7.5 volts to bias the base of transistor T15 while also allowing changes at the output of the difference amplifier to be extended directly to the base of transistor T15 and the base of transistor T4.

In the present invention, the magnitude of each power supply is 6 volts. Since for maximum dynamic range the base voltage of transistor T15 should equal approximately two-thirds of the negative supply, the base of transistor T15 (collector of transistor T9) should be held at a quiescent level of −4 volts. Were two Zener diodes used as in my earlier circuit, since each necessarily has a drop of 7.5 volts, the emitter of transistor T12 would have to be at a potential of −4 +15, or +11 volts. This is impossible in view of the fact the maximum positive supply is only 6 volts. For this reason, only a single level-shifting Zener diode T10 is provided. The drop across the Zener diode is 7.5 volts and its emitter must be at a quiescent level of +3.5 volts if the base of transistor T15 is at −4 volts. The base-emitter drop across transistor T12 is 0.6 volts, and thus the junction of resistors 32$a$, 32$b$ is held at a quiescent level of 4.1 volts.

It is now apparent why the output of the difference amplifier at the junction of resistors 32$a$, 32$b$ cannot be coupled either directly, or through a transistor level-shifting network, to the base of transistor T4. Direct coupling would not allow the base of transistor T4 to be held at ground potential. And the use of a Zener diode would drop the 4.1-volt level at the junction of resistors 32$a$, 32$b$ to −3.4 volts which is too low. (It would be possible to use a string of forward-biased diodes, such as T5, with a 0.6 volt drop across each of them for level-shifting purposes. However, such an approach is impractical for a relatively large voltage drop.)

For this reason, the output of the difference amplifier is fed back to the base of transistor T4 through a resistance divider network. Transistor T11 is provided for isolation purposes. Consider for the moment that resistor 56 is returned to ground, rather than to negative source 20. In such a case, if resistors 54, 56 have a parallel resistance of $R_2$, and resistor 52 has a resistance of $R_1$, the fraction $R_2/(R_1+R_2)$ of a change in the collector voltage of transistor T3 is fed back to the input of the difference amplifier. It can be shown that this less than unity feedback actually increases the gain of the difference amplifier by a factor dependent on the ratio $R_1/R_2$. Only if $R_1=0$ is the gain equal to unity.

Although resistor 56 is returned to negative source 20 rather than to ground, this does not affect the gain; it only affects the quiescent voltage at the junction of resistors 52, 54 and 56. In the quiescent condition, the collector of transistor T3 is at a positive potential; if resistor 56 is returned to ground as is resistor 54, it would note possible for their junction to be at ground potential. However, by returning resistor 56 to the negative source it is possible to select magnitudes for the three resistors such that the junction (base of transistor T4) is normally at ground potential.

There is an internal gain the excess of unity, however, the dynamic range of the gyrator would ordinarily be limited. There is no advantage in providing voltage amplification in the voltage-to-current converter; the function of the unit is to convert a voltage to a current. Moreover, if there is any gain in voltage the transconductance of each voltage-to-current converter will not be determined solely by the value of resistor 46. The gain is undesirable but results from the resistance divider network necessary for DC level shifting. To compensate for the unwanted gain, the base of transistor T12 (the effective signal voltage input for transistor T15) is not connected to the collector of transistor T3. Instead, it is connected to the junction of resistors **32*a* 32*b*. These resistors have magnitudes such that any change in the collector voltage of transistor T3 results in an attenuated change at the base of transistor T12. The attenuation factor (external gain) equals the reciprocal of the internal difference amplifier gain. The overall result is that the voltage gain from the base of transistor T1 to the base of transistor T15** is unity.

In effect, two outputs are taken from the collector of transistor T3, one for driving output transistor T15 and the other for providing feedback within the difference amplifier. In my earlier circuit where only one output is taken for both purposes, two level-shifting Zener diodes are required since the base voltage of transistor T4 is different from that of transistor T15. In the circuit of the present invention, however, only one level-shifting Zener diode T10 is required to properly bias the base of transistor T15. With respect to the feedback, a resistance divider network is utilized for level shifting. While this increases the gain of the difference amplifier, the provision of two collector resistances for transistor T3, rather than only one, allows the gain to be brought back down to unity. (Of course, if some gain is necessary for some reason, resistance **32*a* can be decreased relative to resistance 32*b*, thus reducing the external attenuation. Similarly, resistance 52 can be decreased relative to resistances 54 and 56**.)

The lower voltage-to-current converter is similar to the equivalent converter in my earlier circuit, but includes the same changes discussed in connection with the upper voltage-to-current converter. It should be noted that to achieve the opposite phase control, transistor T12' is driven from the collector of transistor T2', rather than the collector of transistor T3' (the two difference amplifier outputs are opposite in phase). While transistor T2 does not include a collector resistance, such a resistance 32' is required in the lower converter in order to drive transistor T12'. Again, only a single Zener diode T10' is required in order to feed the output voltage at the collector of transistor T2' to the base of transistor T15'.

With respect to transistor T3', only a single collector resistor **32*a*, *b* is required rather than two such resistances 32*a*, 32*b* as in the upper voltage-to-current converter. The only use made of the output at the collector of transistor T3' is for feedback purposes. Resistor 32*a*, *b* has a value equal to the sum of the magnitudes of resistors 32*a* and 32*b*. Thus the feedback circuit in both converters is the same—the collector of each of transistors T3, T3' is returned through the same magnitude resistance to the positive source and is also connected to the base of either transistor T11 or T11'. The impedance of resistor 32' is less than that of resistor 32*a*, *b*. The ratio of the gains at the two collectors of a difference amplifier (aside from their opposite phases) is in direct proportion to the magnitudes of their collector resistances. Since two resistors 32*a*, 32*b* are provided in the upper voltage-to-current converter in order that changes in the base voltage of transistor T12 be attenuated relative to changes in the base voltage of transistor T11, resistance 32' is of less magnitude than resistance 32*a*,*b* in order that changes in the base voltage of transistor T12' be attenuated relative to changes in the base voltage of transistor T11'**.

The circuit of the present invention is similar to my earlier circuit and will be completely understood upon the reading of my copending application. (For example, the purpose of capacitors 48, 48' and 50 is described in that application.) The major difference between the two circuits is that the power dissipation in the present circuit is much less that that in my earlier circuit. Although it is necessary to provide level shifting and internal feedback for maximum high frequency performance, only a single stage of level shifting is required thus allowing the use of lower magnitude dual supplies. Instead of a second stage of transistor level shifting, a resistance network is used for the difference amplifier feedback. Any excessive gain introduced by this feedback can be compensated for by external attenuation.

Although the invention has been described with reference to a particular embodiment it is to be understood that this embodiment is merely illustrative of the application of the principles of the invention. Numerous modifications may be made therein and other arrangements may be devised without departing from the spirit and scope of the invention.

I claim:

1. A gyrator having first and second ports and comprising first and second oppositely phased voltage-to-current converters, each having an input and an output terminal, the input terminal of said first voltage-to-current converter being coupled to the first gyrator port and to the output terminal of said second voltage-to-current converter, the output terminal of said first voltage-to-current converter being coupled to the second gyrator port and to the input terminal of said second voltage-to-current converter, each of said voltage-to-current converters comprising:

a. a difference amplifier having first and second transistors and first and second resistors, each resistor having first and second terminals, the first terminals of said resistors being coupled together, the second terminals of said resistors being coupled to the collector electrodes of said first and second transistors respectively, the base electrode of said first transistor being coupled to the input terminal of the associated voltage-to-current converter, the emitter electrode of said first and second transistors being coupled together;

b. a resistance divider feedback network coupled between the collector electrode of said second transistor and the base electrode of said second transistor;

c. an output stage having an input and an output terminal, the output terminal of said output stage being coupled to the output terminal of the associated voltage-to-current converter;

d. means for coupling the input terminal of said output stage to said difference amplifier, said means being coupled to the junction of the first and second resistors in the difference amplifier of said first voltage-to-current converter, said means being coupled to the collector electrode of said first transistor in said difference amplifier in said second voltage-to-current converter.

2. A gyrator in accordance with claim 1 wherein the means for coupling the input terminal of the output stage to the difference amplifier includes a zener diode.

3. A gyrator in accordance with claim 2 wherein each of said voltage-to-current converters further comprises a third transistor coupled between the base electrode of said first transistor and the input terminal of the associated voltage-to-current converter, the emitter electrode of said third transistor being coupled to the base electrode of said first transistor, the base electrode of said third transistor being coupled to the input terminal of the associated voltage-to-current converter and the collector electrodes of said first and third transistors being coupled together, said first and third transistors being arranged in a Darlington circuit configuration.

4. The gyrator of claim 3 further comprising means coupled between the emitters of said first and third transistors for controlling the quiescent current flow through said first and third transistors.

5. The gyrator in accordance with claim 4 wherein said means for controlling the quiescent current flow through said Darlington circuits comprises a series-connected resistor and unidirectional current flow device.

6. The gyrator of claim 5 wherein said output stage in each of said voltage-to-current converters comprises a constant current source and a fourth transistor, the collector electrode of said fourth transistor being coupled to said constant current source and to the output terminal of said output stage, the base electrode of said fourth transistor being coupled to the input terminal of said output stage.

7. The gyrator in accordance with claim 6 wherein each of said voltage-to-current converters further comprises means coupled between the base electrode of said fourth transistor and a terminal adapted for connection to a source of potential, said means maintaining the quiescent voltage at the base terminal of said fourth transistor equal to approximately two-thirds of the voltage of the source of potential.